United States Patent [19]

Ohmatoi

[11] Patent Number: 4,789,822
[45] Date of Patent: Dec. 6, 1988

[54] THREE-ELECTRODE SENSOR FOR PHASE COMPARISON AND PULSE PHASE ADJUSTING CIRCUIT FOR USE WITH THE SENSOR

[76] Inventor: Naoyuki Ohmatoi, 10-12, 2-chome, Kugenuma, Matsugaoka, Fujisawa-shi, Kanagawa-ken, Japan

[21] Appl. No.: 11,509

[22] Filed: Feb. 6, 1987

[30] Foreign Application Priority Data

Jul. 18, 1984 [JP] Japan .................. 59-149242
Aug. 27, 1986 [JP] Japan .................. 61-201129
Aug. 27, 1986 [JP] Japan .................. 61-201130

[51] Int. Cl.[4] ........................... G01R 25/00
[52] U.S. Cl. ........................... 324/60 R; 307/262; 324/60 CD
[58] Field of Search ............ 324/60 R, 60 C, 60 CD, 324/457, 458, 71.5, 61 R; 73/718, 724, 304 C; 328/55, 155, 56; 307/262, 510, 511, 571

[56] References Cited

U.S. PATENT DOCUMENTS

| | | | |
|---|---|---|---|
| 3,716,782 | 2/1973 | Henry | 324/60 CD X |
| 3,729,675 | 4/1973 | Vosteen | 324/457 X |
| 3,824,454 | 7/1974 | Stern et al. | 324/457 |
| 4,253,057 | 2/1981 | Carlton et al. | 324/57 PS |
| 4,283,639 | 8/1981 | Roesler | 307/262 X |
| 4,349,783 | 9/1982 | Robson et al. | 324/457 |
| 4,387,601 | 6/1983 | Azegami | 324/60 R X |

Primary Examiner—Reinhard J. Eisenzopf
Assistant Examiner—Robert W. Mueller
Attorney, Agent, or Firm—Lowe, Price, LeBlanc, Becker & Shur

[57] ABSTRACT

Two capacitors (C1, C2) having an identical structure and equal capacitance are used in series connection for the detection of phase difference so that ambient temperature affects both the capacitors in a similar manner to compensate for the variation in electrostatic capacitance. The sensor according to one embodiment has a lamination structure that a detection capacitor (C1) is closely attached to a comparison capacitor (C2) providing a short time period for thermal equilibrium of both capacitors. According to another embodiment sensor, since lamination capacitors having identical structure and identical characteristic are electrically connected in series, it is now possible to locate both capacitors at desired points which are spaced apart. A member (34) having a high heat conductivity may be arranged in a space between both the capacitors to thereby reduce the time required for thermal equilibrium. In a pulse phase adjusting circuit used for processing an output signal from the sensor, a variable d.c. voltage is applied via a resistor (R3) to a junction between the detection capacitor (C1) and a resistor (R1), to which junction gate of an FET is connected, so as to control delay time of the pulse, making it possible to perform remote control using a variable resistor (20).

4 Claims, 6 Drawing Sheets

FIG. 18
PRIOR ART

THREE-ELECTRODE SENSOR FOR PHASE COMPARISON AND PULSE PHASE ADJUSTING CIRCUIT FOR USE WITH THE SENSOR

BACKGROUND OF THE INVENTION

This invention relates to an electrostatic capacitor type sensor and a pulse phase adjusting circuit for use with the such a sensor, and more particularly, to electrostatic capacitors used for the detection of water level in pools or rivers, the detection of a substance at a tip portion of hands of a robot, the detection of substances on a belt conveyor in a factory or the like, and so on. The present invention also relates to a pulse transmission circuit arranged such that a series circuit of a capacitor and a resistor is connected to a charging-discharging circuit and to a pulse generator, and a junction between the above-mentioned capacitor and resistor is connected to gate of an FET, and particularly to a circuit for adjusting phase of a pulse signal in such a circuit, which can be widely applied to a water gauge, detection of a substance at the tip of robot hands or on a belt conveyor using an electrostatic capacitance type sensor.

Various types of sensors have hitherto been developed for the detection of water level, or the detection of substances at the the tip portion of robot hands. One of such sensors utilizes the variation in electrostatic capacitance. This sensor detects the existence or an approaching state of an object to be detected by using the variation in distributed capacitance, i.e. stray capacitance, at the time the object approaches a capacitance portion of the sensor, where the variation result in the change in the resonance frequency of a resonance circuit including said capacitor.

Figure 10:
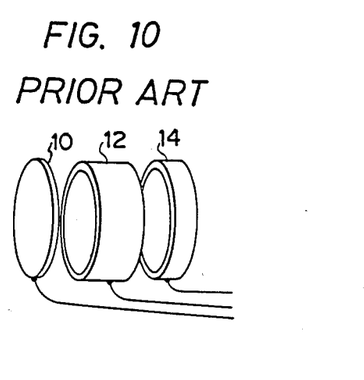
FIG. 10 is a perspective view showing the structure of a conventional sensor.

In such measurement, since it is necessary to select the resonance frequency at a high value, such as several kHz to several MHz, in order to increase the detection accuracy, the electrostatic capacitance of the sensor, which is a component determining the resonance frequency, has to be reduced to an extremely small value. Furthermore, the electrostatic capacitance has to be reduced for ensuring high Q. Normally, the electrostatic capacitance of such a sensor ranges from 0.1 pF to 5 pF. Therefore, in a conventional electrostatic capacitance type sensor, a detection electrode 10 facing an object to be detected, a ground electrode 12 facing the detection electrode, and an additional electrode 14 facing the ground electrode are arranged having a given space therebetween as shown in FIG. 10. Especially, the ground electrode 12 and the additional electrode 14 have a structure that a hollow cylindrical member is arranged axially so that adjacent electrodes do no face each other at their surfaces. When hollow inside of the ground electrode 12 and the additional electrode 14 is filled with a synthetic resin or the like, the resonance frequency and Q drop due to the increase in electrostatic capacitance. For this reason, the above-mentioned hollow portions are left hollow when these electrodes are fixed in a casing of the sensor.

Although the change of electrostatic capacitance due to the variation in ambient temperature is small in the conventional sensors having such structure, when increasing the sensitivity of a measuring circuit to the extreme degree, the resonance frequency is affected by a slight change in the electrostatic capacitance. Therefore, it is difficult to sufficiently increase the detection sensitivity. Although such influence by the change in electrostatic capacitance due to the change in temperature can be bettered to some extent by adding a capacitor having an inverse temperature characteristic, such measures are still insufficient and therefore, there have been no effective compensation measures which prevent the detection sensitivity from dropping due to temperature change.

Furthermore, since the inside of the hollow cylindrical electrode provides a cavity, it has a drawback that strength against an impact is low.

In measuring apparatus, such as a water gauge, using an electrostatic capacitance type sensor, there is known apparatus in which resonance frequency is varied by the change in electrostatic capacitance so that the variation is detected. However, such conventional measuring apparatus has a drawback in connection with detection accuracy and temperature compensation. On the other hand, a measuring circuit of phase comparison type has recently been developed. This circuit detects the difference in electrostatic capacitances between two electrostatic capacitance devices as phase difference. More specifically, as shown in FIG. 15, a pulse signal is fed to a resistor R1 connected to a detection device C1, while the same pulse signal is fed to a resistor R2 connected to a comparison device C2, and phase variation caused from the change in electrostatic capacitance of C1 is detected by two inverter circuits 50 and 432 comprising CMOS IC of FET input type and a flip-flop 60 connected thereto.

In such method of detection of phase difference, it is necessary that the phase at C1 is matched with that at C2 as accurate as possible prior to the commencement of measurement or C1 and C2 are spaced apart as much as possible. Furthermore, it is desirable that the above-mentioned phase difference can be precisely controlled in advance depending on the difference in objects to be detected, measuring state or set threshold.

Figure 16:
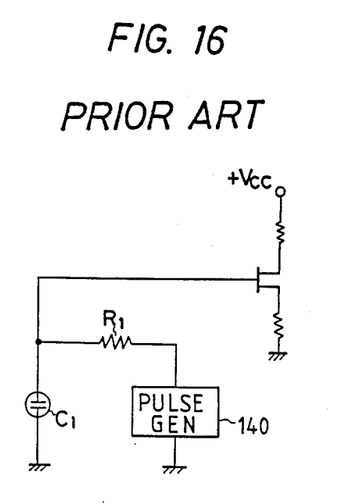
Figure 17:
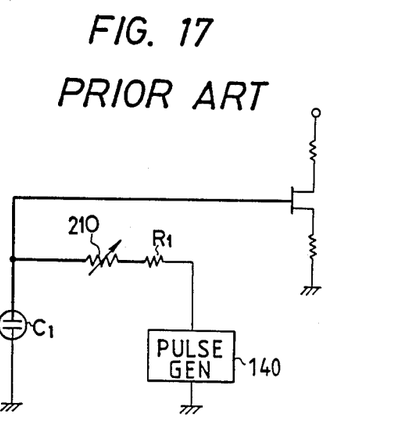
Figure 18:
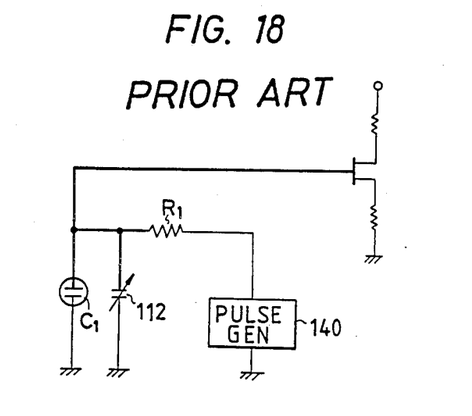

The phases of pulse signals passing through the above-mentioned C1 and c2 are respectively determined by the time constant (C1×R) of the series circuit of C1 and R1, and the time constant (C2×R2) of the series circuit of C2 and R2. Therefore, the above-mentioned phases are arbitrarily set through the adjustment of C1, R1, C2, R2. Generally speaking, continuous and wide range adjustment of the electrostatic capacitance of a capacitor is difficult, and therefore, it is only possible to stepwisely change the same or to obtain slight change by a trimmer capacitor. FIG. 16 shows one channel of the circuit of FIG. 15 schematically, and FIGS. 17 and 18 show structures that a variable resitor 210 or a trimmer capacitor 212 is added as phase adjusting means to the apparatus of FIG. 16. In the case of FIG. 15, phase difference can be freely set by manually adjusting the variable resistor 210 in the same manner as in FIG. 17.

Figure 15:
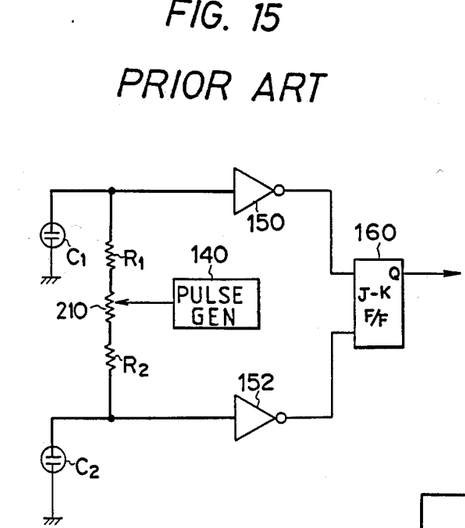
FIGS. 15 to 18 are diagrams showing conventional apparatus.

In the above-mentioned conventional apparatus of FIG. 15, portions indicated by thick lines are required to be wired as short as possible. This is because stray capacitance or distributed capacitance may result in error or malfunction. This also applies to FIGS. 16 and 17. For this reason, the variable resistor 210 and the trimmer capacitor 212 of FIGS. 15, 17 and 18 could no be separately positioned to be remote from the sensor body including the capacitor C1. Therefore, when the position of the sensor is at an extremely low or high place, or in a complex apparatus, it is very difficult to perform phase adjustment, and in some cases such adjustment is substantially impossible. In this way, phase adjustment has hitherto been difficult in conventional apparatus.

SUMMARY OF THE INVENTION

The present invention has been developed in order to remove the above-described drawbacks inherent in the conventional electrostatic capacitance type sensor and a signal processing circuit responsive to such a sensor.

It is, therefore, an object of the present invention to provide new and useful electrostatic capacitance type sensor which exhibits high sensitivity without being affected by the change of ambient temperature and to provide a pulse phase adusting circuit for use with such a sensor so that a manually adjusting member can be positioned remote from the sensor body to perform remote control.

According to a feature of the present invention, first of all the capacitor as a detection device is not used as a device for forming a resonance circuit but is combined with a measuring circuit which measures the variation in electrostatic capacitance of the sensor as the change in phase, and therefore, it is possible to increase the electrostatic capacitance to the order of several tens of pF to several hundreds of pF. Two capacitors having the identical structure and equal capacitance are used in series connection for the detection of phase difference, and according to the present invention, a detection capacitor and a comparison capacitor are arranged to have substantially the same structure. Moreover, with an arrangement that ambient temperature affects both the capacitors in a similar manner, the variation in electrostatic capacitance due to the change in ambient temperature is offset and cancelled to thereby perform temperature compensation.

Since the sensor according to the above-mentioned first embodiment of the present invention has a lamination structure that the detection capacitor is closely attached to the comparison capacitor, the time required for the thermal equilibrium of both capacitors is short, and thus temperature compensation can be performed securely and rapidly. Furthermore, the change of stray capacitance due to temperature change can be neglected because the electrostatic capacitance is extremely larger than the stray capacitance.

On the other hand, according to the above-mentioned second embodiment sensor, since lamination capacitors having identical structure and identical characteristic are electrically connected in series, it is now possible to locate both capacitors at desired points which are spaced apart. In this case, in order that one capacitor is used for detection and the other is used for temperature compensation, a member having a high heat conductivity is arranged in a space between both the capacitors to thereby reduce the time required for thermal equilibrium.

In the above-mentioned first and second embodiments, when the capacitor devices are arranged to have metallic foil on both surfaces of flexible film like dielectric members, the shape of the capacitor device, i.e. electrode, can be changed by bending, without being limited to flat shape, to assume various shapes.

In a pulse phase adjusting circuit used for processing an output signal from the sensor, instead of changing the time constant per se of the CR charging-discharging circuit a d.c. voltage is applied via a resistor to a junction between a capacitor and a resistor, i.e. gate of an FET, so as to retard the rising of a pulse, and to control delay time of the pulse by adjusting the d.c. voltage by way of a variable resistor for accurately controlling phase difference.

In this way, according to the present invention since variable d.c. voltage is applied to gate of FET, the variable resistor is not required to be located near the sensor body, and thus remote control is available.

In accordance with the present invention there is provided a three-electrode sensor arranged such that two capacitors are connected to each other in series to be used in a measuring apparatus which detects phase difference caused from the difference in electrostatic capacitance, characterized in that by first, second and third disc like electrodes arranged in parallel to each other, and film like dielectric members respectively interposed between said first and second electrodes and between said second and third electrodes.

In accordance with the present invention there is also provided a three-electrode sensor arranged such that two capacitors are connected to each other in series to be used in a measuring apparatus which detects phase difference caused from the difference in electrostatic capacitance, characterized in that each of said two capacitors comprises first and second disc like electrodes and a film like dielectric member interposed between said first and second electrodes, by having means for electrically connecting said second electrode of said one of said two capacitors to said first electrode of the other capacitor, and in that a member having a high heat conductivity is arranged between said second electrode of said first mentioned capacitor and said first electrode of said latter mentioned capacitor.

In accordance with the present invention there is further provided a pulse phase adjusting circuit in a pulse transmission circuit having a series circuit of a first resistor connected to a pulse generator in series and a first capacitor, and an FET whose gate is connected to a junction between said first resistor and said first capacitor, said pulse phase adjusting circuit comprising a second resistor whose one end is connected to said junction, a ground capacitor connected to the other end of said second resistor, and a variable resistor connected to a d.c. power source for making a d.c. voltage to be fed to the other end of said second resistor adjustable.

BRIEF DESCRIPTION OF THE DRAWINGS

The object and features of the present invention will become more readily apparent from the following detailed description of the preferred embodiments taken in conjunction with the accompanying drawings in which.

The same or corresponding elements and parts are designated at like reference numerals throughout the drawings.

DETAILED DESCRIPTION OF THE INVENTION

Figure 1:
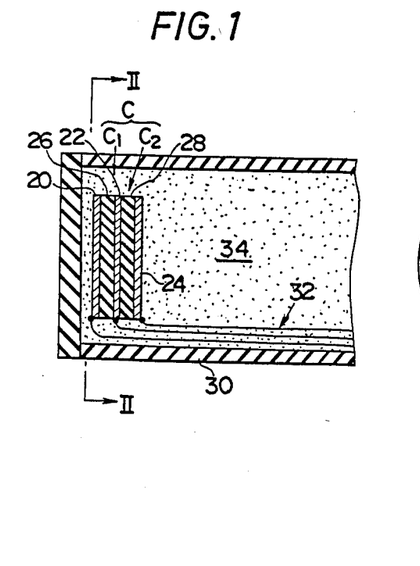
FIG. 1 is a side cross-sectional view of a first embodiment of a sensor according to the present invention.
Figure 2:
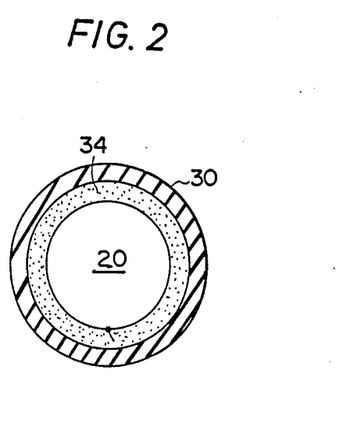
FIG. 2 is cross-sectional view viewed from line II—II of FIG. 1.

Referring now to FIG. 1, a cross-sectional view of a three-electrode sensor according to the first embodiment of the present invention is illustrated. FIG. 2 is a cross-sectional view taken along line II—II OF FIG. 1. This sensor comprises a capacitor assembly C of five-layer structure, which is received in a casing 30 made of a synthetic resin or the like, and inner space of the casing 30 is filled with a filling 34 made of a synthetic resin, such as an epoxy resin or the like. The capacitor assembly C comprises a detection capacitor C1 and a comparison capacitor C2. More specifically, three sheets of metallic foil 20, 22, 24, such as copper foil, and two sheets of film like dielectric substrates 26 and 28 made of polyimide or the like are laminated to provide a five-layer sandwich lamination structure. The metallic foil sheets 20, 22, 24 are either adhered to the substrates 26, 28 or deposited through chemical processing, vapor deposition, sputtering or the like. The metallic foil sheets 20 and 24 are respectively the detection electrode and the comparison electrode, and a center metallic foil sheet 22 which is common to both the capacitors is a ground electrode. Since this ground electrode 22 is positioned between the two capacitors C1 and C2, it also operates as an electrostatic shield. To one end of each of the electrodes 20, 22, 24 is attached a lead wire 32. As to the material of the dielectric substrates 26 and 28, may be used other synthetic resin, ceramic, or thin plates of glass. However, when it is intended to bend the dielectric substrates as will be described hereinlater, flexible substrates, such as those made of polyimide, are suitable. In such a case, the thickness from 50 micrometers to 100 micrometers is most suitable. Furthermore, even if the dielectric substrates 26 and 28 are not bent, it is preferable that the thickness thereof is less than 1 mm in view of capacitance and heat conductivity.

As shown in FIG. 2, although the capacitor assembly C has a circular configuration to be received in the cylindrical casing 30, the shape thereof is not limited to a circular one, and may be changed to a desired one, such as a polygonal shape, ellipsoidal shape and so on. The capacitor assembly C is fixed by the filling 34 to be tough enough against external impacts. It is desired that C1 and C2 have identical configuration, identical dimension, identical material so as to have equal electrostatic capacitance, and it is also desired that the error of the same is within 6%.

Figure 5:
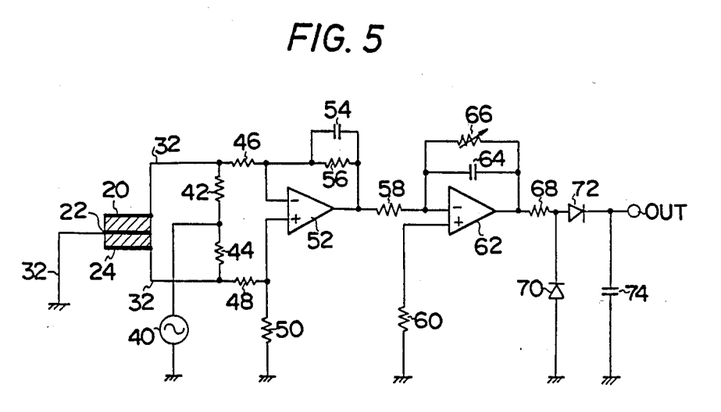
FIGS. 5 and 6 are diagrams showing examples of circuits for measuring a distance to an object to be detected by processing the output from the sensor according to the present invention.
Figure 6:
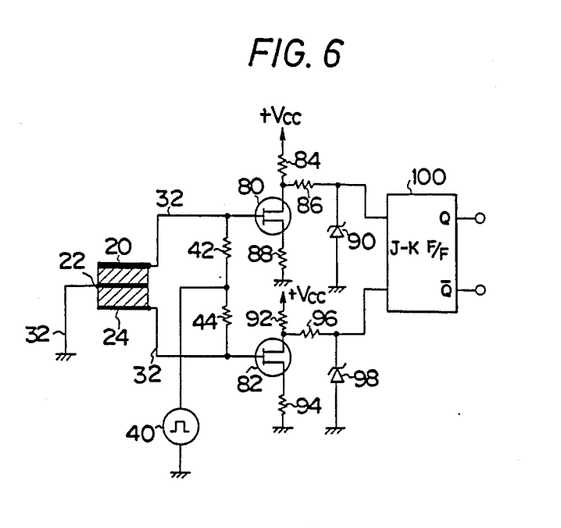

The first embodiment of the present invention shown in FIGS. 1 and 2 operates as follows. The tip (left end in FIG. 1) of the casing 30 is located at a position so that an unshown measuring object can approach, and then the lead wires 32 are connected to a measuring circuit shown in FIGS. 5 and 6. In FIGS. 5 and 6, the reference 40 indicates an a.c. power source; 40', a pulse generating circuit; 42, 44, 46, 48, 50, 56, 58, 60, 68, 84, 86, 88, 92, 94, 96, resistors; 52, 62, operational amplifiers; 54, 64, 74, capacitors; 66, a variable resistor; 70, 72, diodes; 80, 82; FETs; 90, 98; zener diodes; 100, J-K flip-flop. The operational amplifier 52, capacitor 54, resistor 56, operational amplifier 62, capacitor 64 and variable resistor 66 constitute a low-pass filter.

Describing the circuit of FIG. 5 first, a.c. current from the a.c. power source 40 is fed via resistors 42 and 44 to the detection electrode 20 and the comparison electrode 24 of the first and second capacitors C1 and C2 respectively. Meanwhile, the ground electrode 22 which is common to the capacitors C1 and C2 is grounded. Assuming that the electrostatic capacitances of C1 and C2 are equal to each other, the phases of the currents flowing into the detection electrode and the comparison electrode 24 are equal to each other. Therefore, the potentials at inverting (−) input and noninverting (+) input of the operational amplifier 52 vary in the same manner to produce zero output at the output of the operational amplifier 52. As a result, the output of a next stage operational amplifier 62 also assumes zero so that output from a terminal OUT becomes zero. When an object to be detected approaches the detection electrode 20, the stray capacitance of the detection electrode 20 increases to increase apparent electrostatic capacitance of C1. Therefore, the phase of the current flowing into the detection electrode 20 advances more than the phase of current flowing into the detection electrode 24. As a result, there occurs a phase difference between two input signals to the operational amplifier 52, and a d.c. output corresponding to the phase difference is obtained as an output at the output terminal OUT. Consequently, it is possible to know the distance to an approaching measuring object by monitoring the output voltage. The variable resistor 66 is provided for adjusting the detection sensitivity depending on the sort of the measuring objects, the attaching position of the sensor and so on.

Assuming that the sensor ambient temperature has risen, the volume of the dielectric members 26 and 28 increases to increase their thickness. As a result, the electrostatic capacitances of both capacitors C1 and C2 decrease in the same manner. Since C1 and C2 are closely attached via the ground electrode 22 to each other, the temperature variation at the tip of the sensor, i.e. at the C1, is rapidly transmitted to C2, and thus the period of time required for thermal equilibrium is extremely short. Therefore, temperature compensation is readily achieved so as to prevent detection error due to the variation in electrostatic capacitance caused from ambient temperature.

In the case of the circuit of FIG. 6, a pulse generating source 40' is used in place of the a.c. power source 40 of FIG. 5. When the electrostatic capacitance of C1 is equal to that of C2, the phases of the signals fed to the gates of FETs 80 and 82 are equal to each other, and thus the phases of the two input signals to the J-K flip-flop 100 are equal to each other so that the outputs Q and $\overline{Q}$ of the J-K flip-flop 100 repeatedly output 1 and 0 alternately.

As the object to be detected approaches the detection electrode 20, the phase at the side of C1, i.e. at the side of FET 80, advances more than the phase at the FET 82. Therefore, the pulse width of the output pulse signal from the J-K flip-flop increases, and thus, the distance to the object to be detected can be measured by detecting the increment of the pulse width with the output pulse signal being fed to a known pulse width detecting circuit (not shown). Since the electrostatic capacitances of C1 and C2 vary at substantially the same time in response to the change in ambient temperature in the me manner as described in connection with FIG. 5, no phase difference occurs to perform temperature compensation in the same manner as in FIG. 5.

Although electrodes and dielectric members are stacked to provide five layers in the embodiment of FIG. 1, it is also possible to provide another electrode via another dielectric layer on (at the right in FIG. 1) the comparison electrode 24 so as to connect the same to the ground electrode 22. Namely, this provides a seven-layer structure with which the comparison electrode 24 is positioned between two sheets of electrodes which are grounded to thereby provide effective electrostatic shield.

Figure 3:
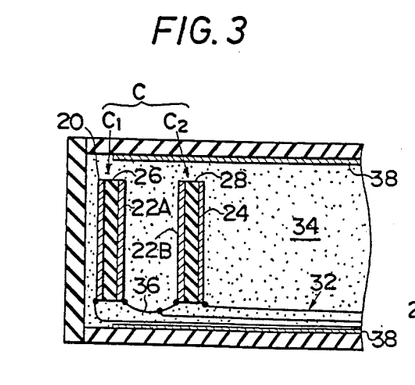
FIG. 3 is a side cross-sectional view of a second embodiment of a sensor according to the present invention.
Figure 4:
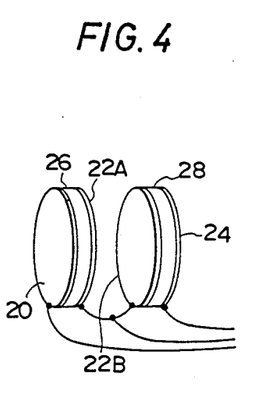
FIG. 4 is a perspective view showing an important part of the sensor of FIG. 3.

FIG. 3 is a side cross-sectional view showing an embodiment of a sensor according to the second embodiment of the three-electrode sensor according to the present invention, and FIG. 4 is a perspective view of an important portion of the same. The detection capacitor C1 and the comparison capacitor C2 are three-layer capacitors having identical structure, and C1 is made by providing metallic foil sheets 20 and 22A to both surfaces of the dielectric substrate 26 while C2 is made by providing metallic foil sheets 22B and 24 to both surfaces of the dielectric substrate 28. The metallic foil sheet 22A and 22B are electrically coupled with each other via a conductive wire 36 so as to function as ground electrodes. The reference 38 is a shielding member provided insides the cylindrical casing 30, and the reference 34 is a filling which is similar to that in FIG. 1. By selecting a substance having high heat conductivity as the filling, the time period required for thermal equilibrium between the two capacitors can be reduced. Although C2 is used as a comparison capacitor in this embodiment, a comparing apparatus can be formed when C1 and C2 are used as detection capacitors by separating them from each other. Examples of such comparing apparatus are those which distinguishes deteriorated liquid from fresh liquid, which compares the sizes of members or distances to the same. When it is not required to locate C1 and C2 by spacing one from another by a given distance, the electrodes 22A and 22B can be connected to each other. In this case, a capacitor assembly substantially the same as the five-layer structure shown in FIG. 1 can be obtained.

Figure 7:
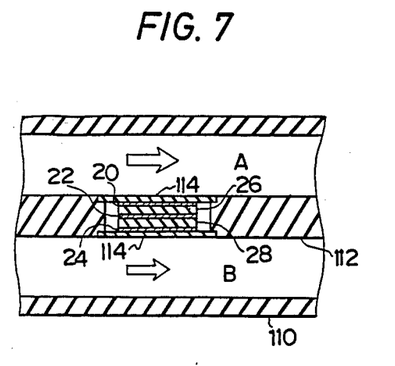
FIGS. 7 to 9 are diagrams showing examples of application of the sensor according to the present invention.

Now examples of application of the sensor according to the present invention will be described. FIG. 7 shows an application example of the first embodiment, which is apparatus for measuring dielectric constant of liquid. In this apparatus, a partition 112 is provided at the center of a pipe 110, and a through-hole is made in the partition 112 to mount the capacitor assembly of the sensor according to the first embodiment shown in FIG. 1 therein. The reference 114 indicates transparent partitions which are provided at both ends of the through-hole of the partition 112 to cover the same, while the capacitor assembly C is interposed between the two partitions. Within the pipe 110, it is arranged that liquid A to be measured is flown above the partition while standard liquid B having known dielectric constant is flown under the same. The difference in dielectric constant between both liquids A and B can be measured by way of a measuring circuit of FIG. 5 or 6 using the phase difference.

Figure 8:
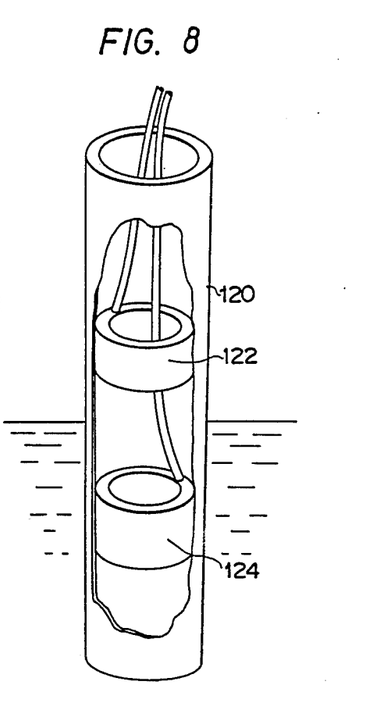
Figure 9:
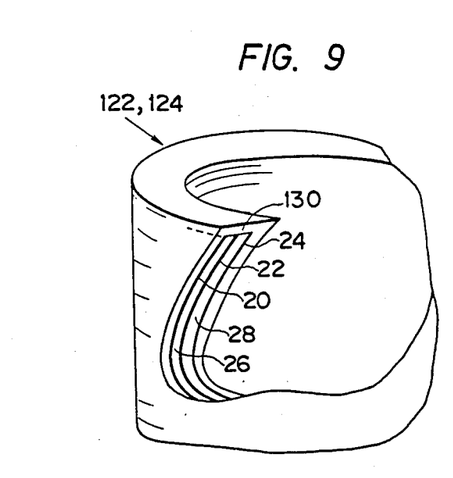

FIG. 8 shows an example of the application of the sensor according to the first embodiment to a water gauge. This water gauge is arranged such that two capacitor assemblies C' and C" are mounted in the hollow portion of a pipe made of vinyl chloride or the like. Partial cross-sectional perspective view of the capacitor assemblies C', C" is shown in FIG. 9. The capacitor assemblies C', C" are manufactured by covering the five layer capacitor shown in FIG. 1 by way of a covering member 130. As the dielectric members 26 and 28 are used flexible film like material, such as polyimide, so as to form a cylindrical capacitor assembly C'.

As water level rises so that warter approaches a portion around the lower capacitor assembly C", it is possible to detect that water level has risen to a level around the lower capacitor assembly C' by detecting the phase difference caused from the increase in stray capacitance in the same manner as described with reference to FIGS. 5 and 6. As the water level rises further, the upper capacitor assembly C" detects the same in the same manner.

Although an outer electrode of the capacitor assemblies C' and C" is used as the detection electrode in the examples of FIGS. 8 and 9, the inner electrode may by used as the detection electrode instead. In this case, the cylindrical capacitor assembly is arranged around an object to be detected.

As is apparent from the above description, according to the first embodiment of the sensor according to the present invention two capacitors are arranged to have five-layer structure as the sensor for measuring apparatus of phase difference detection system, and also by arranging the configuration, size, material and so to be common so as to make it possible to cancel and compensate for the influence by the change in ambient temperature. Therefore, in an electrostatic capacitance type sensor, which could perform stable detection under a temperature up to only 70° C. or so, can now perform accurate operation even at a high temperature such as 90° C. or so and can obtain satisfactory sensitivity. In this way, the influence by temperature change can be reduced, and therefore, it is possible to raise the sensitivity to twice or three times that of conventional sensors, while periodic calibration is now unnecessary. More specifically, it is possible to detect the variation less than 0.05 pF when an object approaches. Furthermore, although conventional sensors could not employ a large-sized capacitor due to the limitation in electrostatic capacitance, while the configuration and location of the electrodes could not freely changed, it is now possible to employ a large-sized one while the configuration and location of electrodes can be freely changed in accordance with measuring object and circumstances by adopting phase difference detection system and by performing temperature compensation.

In conventional sensor, since the self electrostatic capacitance of the capacitor device is as small as 0.1 pF to 5 pF, the ratio of peripheral stray capacitance to self capacitance ranges from approximately $\frac{1}{3}$ to $\frac{1}{2}$. On the other hand, in the present invention since self capacitance can be made as large as 10 pF to 50 pF, the same ratio can be reduced as small as 1/1000 to 1/100. Accordingly, the influence by the change in peripheral stray capacitance due to temperature change can be extremely reduced. Moreover, there is an advantage that the sensors can readily be mass-produced in the same manner as electronic parts such as semiconductor devices because of the lamination structure. In addition, since it is possible to fill a synthetic resin for securing the capacitor assembly or assemblies within the sensor casing, the sensor would be tough against impacts.

According to the second embodiment of the sensor according to the present invention, two of three-layer capacitors of identical structure are connected in series, and therefore, it is possible to position the detection capacitor and the comparison capacitor at remote places, and when a member having high heat conductivity is positioned between the capacitors, it is possible to reduce the time period required for thermal equilibrium.

Figure 11:
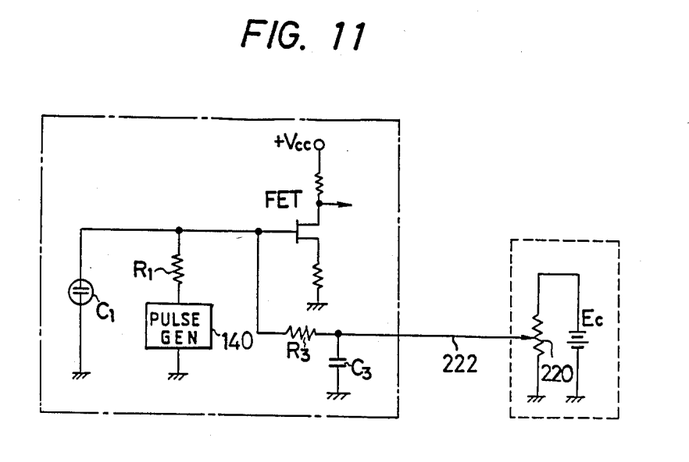
FIGS. 11 to 14 are diagrams for describing embodiments of the pulse phase adjusting circuit according to the present invention.
Figure 12:
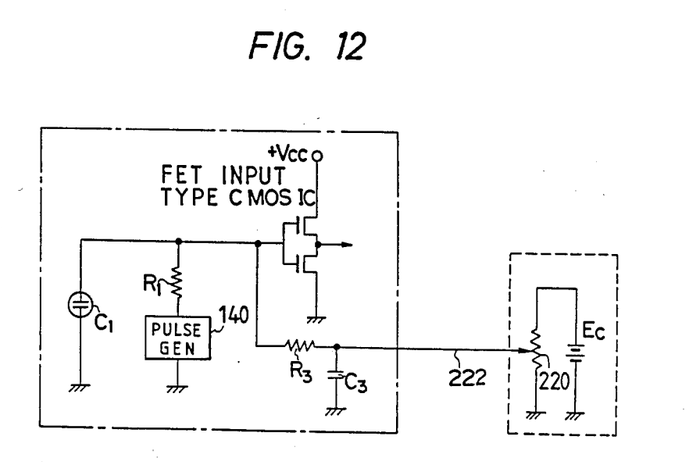
Figure 13:
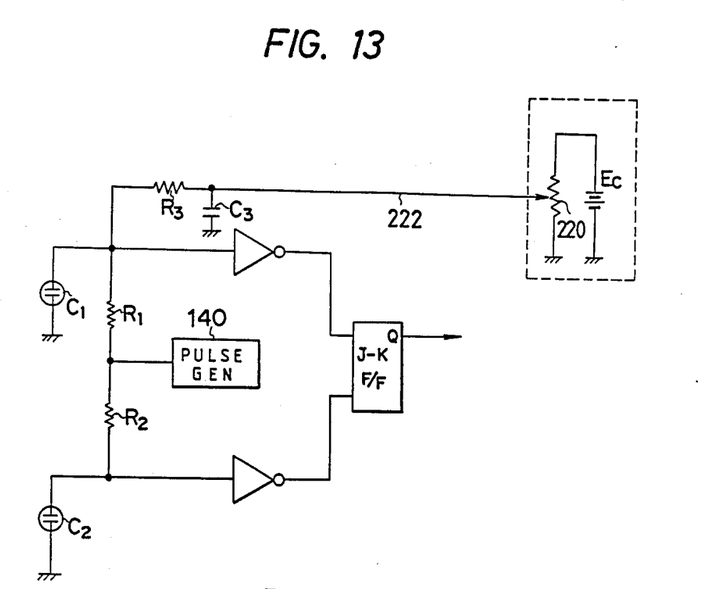

Now the pulse phase adjusting circuit for use with the above-described sensor will be described. FIGS. 11 through 14 are circuit diagrams showing embodiments of the pulse phase adjusting circuit according to the present invention. FIG. 11 shows an embodiment using an FET device, while FIG. 12 shows an embodiment using a CMOS IC of FET input type. In FIGS. 11 and 12, only a channel including a detection electrostatic capacitance device C1 is shown and a channel including a comparison device is omitted for simiplicity. In FIG. 13, a circuit of a detection device C1 and a circuit of a comparison device C2 are shown to be combined. In these diagrams, the references R1, R2 and R3 indicate resistors; 140, a pulse generating circuit; C3, a capacitor; 220, a variable resistor; and Ec, a d.c. power source. In these diagrams, dot-dash lines indicate a portion to be received in a casing of a sensor.

As the resistor R3 is used one having a high resistance, such as 1 Mohms, and preferably a resistor showing stable temperature characteristic, such as a metal oxide film resistor, is used. The capacitor C3 is a passing capacitor whose one terminal is connected to a junction between the resistor R3 and the variable resistor 220, and the other terminal is grounded for grounding unnecessary noise.

As the d.c. power source Ec is used a constant voltage power source. This d.c. voltage is divided by the variable resistor 220 so that a desired voltage is fed via the resistor R3 to the junction between the resistor R3 and the capacitor C1 (sensor device).

Prior to the commencement of measurement the phase difference is adjusted to a desired value by the variable resistor so that measuring accuracy and threshold can be set. Since the dot-dash line portion including the variable resistor 220 is located remote from the casing of the sensor, the control of the phase adjustment can be readily performed at a remote place. The reason that the variable resistor 220 can be separated from the sensor, is that only temperature characteristics of R1, C1, C2, R3 and the conductance of the semiconductor portion of the FET affect the time constant since a high resistance is used for R3 and that a cable portion 222 from the capacitor C3 to the variable resistor 220 is of lower impedance than the input impedance of the FET so that time constant is not affected even if this cable 222 is extended up to several meters or more.

The above-mentioned pulse generating circuit 140 may be arranged to generate rectangular pulses or triangular pulses.

Figure 14:
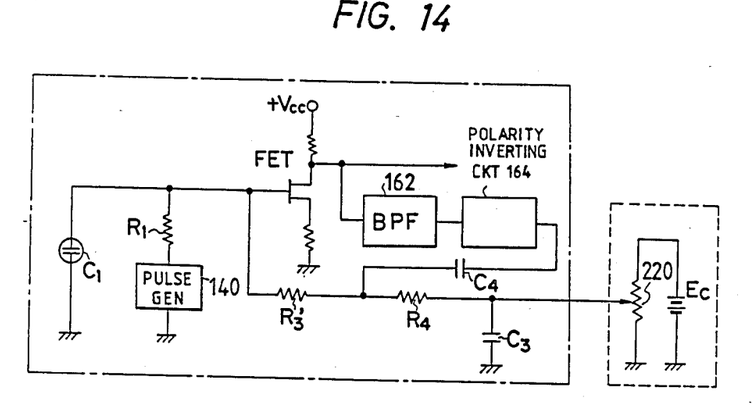

FIG. 14 shows an embodiment which is an improvement of the circuit of FIG. 11. In this embodiment, a band-pass filter 162 connected to source of the FET has a center frequency corresponding to commercial frequency (50 to 60 Hz), and its output is fed via a capacitor C4 to a junction between resistors R3 and R4 with the polarity being inverted by a polarity inverting circuit 164. In this embodiment, the high resistance resistor R3 of FIG. 13 is replaced with a series circuit of two resistors R3' and R4. R3' has a resistance value as high as 1 Mohms or so, while R4 may be in the order of 30 to 50 kohms.

The embodiment of FIG. 14 reduces commercial frequency component which is introduced during measuring using the electrostatic capacitance type sensor C1, by way of negative feedback. Such interference waves of commercial frequency are apt to be introduced when measuring liquid, and would cause errors and/or malfunction such that the pulse signal is phase modulated. In this embodiment, a commercial frequency component, which is superimposed upon the output signal from the FET, is extracted by the band-pass filter 162 and then the polarity of the extracted component is inverted by the polarity inverting circuit 164 to be superimposed upon a d.c. bias from the d.c. power source Ec so as to negative feedback to gate of the FET. With this arrangement, external disturbance due to commercial frequency can be suppressed.

With the above-described structure it is now possible to mount the manually operable variable resistor at a point remote from the sensor portion, and therefore, phase difference can readily be controlled through remote control even after the sensor has been attached to a measuring point.

Furthermore, since phase control can be securely performed with less number of parts according to the present invention, the structure is simple and cost is low, and since the number of part connected to gate of the FET is small, a stable apparatus can be provided without deteriorating the temperature characteristic of the whole apparatus.

The above-described embodiments are just examples of the present invention, and therefore, it will be apparent for those skilled in the art that many modifications and variations may be made without departing from the scope of the present invention.

What is claimed is:

1. A pulse phase adjusting circuit for adjusting a threshold sensitivity in a pulse transmission circuit having a parallel circuit of a first resistor connected in series to a pulse generator and a first electrostatic sensing capacitor, and an FET for supplying an output signal, a control terminal of said FET whose gate is connected to a junction between said first resistor and said first electrostatic sensing capacitor, characterized by a second series resistor having one end connected to said junction, a ground capacitor for filtering noise connected to the other end of said second resistor, and a variable resistor connected to a d.c. power source for adjusting a voltage from said power source and applying said adjusted voltage through said second resistor to said junction to adjust a pulse phase at said FET control terminal, whereby said threshold sensitivity is controlled.

2. A pulse phase adjusting circuit as claimed in claim 1, characterized in that said first capacitor is an electrostatic capacitance detection sensor, and in that said variable resistor is located at a position remote from said sensor.

3. A pulse phase adjusting circuit as claimed in claim 1, characterized in that said FET is a CMOS IC of FET input type.

4. A pulse phase adjusting circuit as claimed in claim 1, characterized by a feedback circuit comprising a band-pass filter connected to a source of said FET, a polarity inverting circuit connected to an output of said band-pass filter, and a capacitor connected to an output of said polarity inverting circuit, in that said second resistor comprises two resistors connected in series, and in that said capacitor is connected to the junction of said two resistors.

* * * * *